(12) United States Patent
Usui et al.

(10) Patent No.: US 7,495,344 B2
(45) Date of Patent: Feb. 24, 2009

(54) SEMICONDUCTOR APPARATUS

(75) Inventors: Ryosuke Usui, Ichinomiya (JP);
 Atsuhiro Nishida, Ohgaki (JP); Hideki Mizuhara, Bisai (JP); Takeshi Nakamura, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/082,150

(22) Filed: Mar. 16, 2005

(65) Prior Publication Data
 US 2005/0205996 A1    Sep. 22, 2005

(30) Foreign Application Priority Data
 Mar. 18, 2004  (JP)  .............................. 2004-079282
 Mar. 30, 2004  (JP)  .............................. 2004-101545

(51) Int. Cl.
 *H01L 23/28* (2006.01)
 *H01L 23/29* (2006.01)

(52) U.S. Cl. ................ 257/787; 257/788; 257/789; 257/795; 257/E21.499; 257/E23.116

(58) Field of Classification Search ................ 438/106, 438/108, 113, 122, 125, 126; 257/788, 753, 257/789, E21.499, E23.116, 787, 795
See application file for complete search history.

(56) References Cited

U.S. PATENT DOCUMENTS

| | | | | |
|---|---|---|---|---|
| 5,393,406 A | * | 2/1995 | Yokono et al. ............... | 205/125 |
| 6,590,292 B1 | * | 7/2003 | Barber et al. ................ | 257/778 |
| 6,627,997 B1 | * | 9/2003 | Eguchi et al. ................ | 257/777 |
| 6,632,704 B2 | * | 10/2003 | Kumamoto et al. .......... | 438/106 |
| 6,670,223 B2 | * | 12/2003 | Gaynes et al. ............... | 438/118 |
| 6,790,706 B2 | * | 9/2004 | Jeung et al. .................. | 438/113 |
| 6,951,773 B2 | * | 10/2005 | Ho et al. ...................... | 438/106 |
| 2002/0038918 A1 | * | 4/2002 | Gotou et al. .................. | 264/39 |
| 2004/0161593 A1 | * | 8/2004 | Yamazaki et al. ............ | 428/209 |

FOREIGN PATENT DOCUMENTS

| | | |
|---|---|---|
| JP | 10-340914 | 12/1998 |
| JP | 11-204720 | 7/1999 |
| JP | 2002-93826 | 3/2002 |
| JP | 2002-198458 | 7/2002 |
| JP | 2003-78106 | 3/2003 |
| JP | 2003-133717 | 5/2003 |
| JP | 2004-47823 A | 2/2004 |

\* cited by examiner

*Primary Examiner*—Long K Tran
(74) *Attorney, Agent, or Firm*—Fish & Richardson P.C.

(57) ABSTRACT

A semiconductor apparatus includes a substrate and elements or semiconductor chips provided on the substrate. The elements are sealed by being brought into contact with a sealing compound. The surface of contact on the elements or the sealing compound is plasma treated. The semiconductor chip is adhesively attached to another semiconductor chip via an adhesive compound. The surface of the semiconductor chip in contact with the adhesive compound is plasma treated.

3 Claims, 13 Drawing Sheets

PLASMA TREATMENT

BONDING

PRIOR ART

POLISHING AND RINSING

PLASMA TREATMENT

FIG.14

SURFACE COMPOSITION (atomic%)

|  | Si | O | C | N |
|---|---|---|---|---|
| W/O TREATMENT A | 49.0 | 45.1 | 5.3 | 0.6 |
| W/O TREATMENT B | 47.8 | 46.1 | 5.7 | 0.4 |
| Ar PLASMA TREATMENT A | 27.0 | 68.2 | 4.0 | 0.8 |
| Ar PLASMA TREATMENT B | 27.3 | 68.0 | 4.1 | 0.7 |
| $O_2$ PLASMA TREATMENT A | 27.3 | 68.7 | 3.5 | 0.6 |
| $O_2$ PLASMA TREATMENT B | 27.6 | 68.6 | 3.2 | 0.6 |

FIG.15

C1sPEAK SEPARATION RESULTS (%)

|  | COO (CON) | C=O | C-O (C-N) | CHx |
|---|---|---|---|---|
| W/O TREATMENT A | 2 | 9 | 36 | 53 |
| W/O TREATMENT B | - | 9 | 41 | 50 |
| Ar PLASMA TREATMENT A | 7 | 3 | 23 | 67 |
| Ar PLASMA TREATMENT B | 5 | 5 | 20 | 70 |
| $O_2$ PLASMA TREATMENT A | 4 | 5 | 21 | 71 |
| $O_2$ PLASMA TREATMENT B | 6 | 3 | 19 | 72 |

SEMICONDUCTOR APPARATUS

BACKGROUND OF THE INVENTION

1. Field of the Invention

The present invention relates to a semiconductor apparatus on which elements or semiconductor chips are mounted, and also relates to a method of fabricating the apparatus.

2. Description of the Related Art

With portable electronic appliances such as mobile phones, PDAs, DVCs and DSCs becoming more and more advanced in their capabilities, miniaturization and weight reduction of products have become essential for market acceptance. Accordingly, highly-integrated system LSIs for achieving these goals are demanded. Also, better ease and convenience of use are required of these electronic appliances. In this respect, high capabilities and high performance are required of LSIs used in these appliances. While the number of I/Os is increasing as a result of increasingly high integration of LSI chips, there is also a persistent requirement for miniaturization of packages themselves. In order to meet these incompatible demands, development of a semiconductor package adapted for high-density substrate mounting of semiconductor components is in serious demand.

Ball grid array (BGA) is known as an example of package adapted for a demand for high density. A BGA is formed such that semiconductor chips are mounted on a package substrate and then molded by resin. Solder balls are formed as terminals in selected areas on the opposite side. In BGA, an uninterrupted mounting area is secured so that miniaturization of a package is achieved relatively easily. The circuit board need not be adapted for small pitch and a high-precision mounting technology is not necessary. Therefore, by using BGA, the total mounting cost may become reduced even if the package cost is relatively high.

FIG. 6 is a schematic illustration of the structure of a BGA generally used. The BGA 100 is constructed such that an LSI chip 102 is mounted on a glass epoxy substrate 106 via an adhesive layer 108. The LSI chip 102 is molded by sealing resin 110. The LSI chip 102 and the glass epoxy substrate 106 are electrically connected by a metal wire 104. On the back surface of the glass epoxy substrate 106 are arranged solder balls 112 in arrays. The BGA 100 is mounted on a printed circuit board via the solder balls 112. In the technology for mounting elements on the substrate and sealing the elements, it is important to ensure satisfactory adhesion between the substrate and the sealing resin and between the elements and the sealing resin.

A method of building a stack of semiconductor chips is known as a technology adapted for a demand for high density (see the patent document No. 1). FIG. 7 illustrates the structure of a chip size package (CSP) described in the above-mentioned document. A semiconductor chip 1 is mounted on an insulating substrate 3 provided with an interconnect layer 4 on its surface, with the circuit facing upward. A semiconductor chip 2 is mounted on the semiconductor chip 1 via a thermal adhesion sheet 7. The semiconductor chips 1 and 2 and an electrode part of the interconnect layer 4 are connected to each other by a wire 8. The semiconductor chips 1 and 2 and the wire 8 are sealed by resin.

When semiconductor chips are build in layers, however, satisfactory adhesion between the semiconductor chips built in layers is not ensured, causing the reliability of elements to become poor and the yield in element fabrication process to drop. When building layers of semiconductor chips, it is important to ensure satisfactory adhesion between the semiconductor elements built in layers. When adhesion at the interface is poor, the elements are affected by thermal stress and humidity, causing the reliability of elements to become poor.

Related Document No. 1
Japanese Published Patent Application No. 11-204720

SUMMARY OF THE INVENTION

The present invention has been done in view of the aforementioned circumstances and its object is to improve, in a semiconductor apparatus on which elements are mounted, adhesion between a substrate and a sealing compound or between the elements and the sealing compound and to provide a semiconductor apparatus in which the reliability of the elements high. Anther object is to improve, in a semiconductor apparatus in which semiconductor chips are mounted in layers, adhesion between a substrate and the semiconductor chips or between the semiconductor chips themselves.

The present invention according to one aspect provides a semiconductor apparatus comprising: a substrate; elements provided on the substrate; and a sealing compound provided on the substrate and sealing the elements, wherein the substrate and the sealing compound are brought into contact with each other, the elements and the sealing compound are brought into contact with each other, and a surface of the sealing compound in contact with the substrate or a surface of the sealing compound in contact with the elements is plasma treated. With this, the bottom surface of the sealing compound is plasma treated so that adhesion with the substrate and the elements adhesively attached underneath is significantly improved. As a result, the reliability of elements is improved due to reduced effects from thermal stress and humidity.

A plurality of minute projections may be formed on the surface of the sealing compound in contact with the substrate or the surface of the sealing compound in contact with the elements. With this, adhesion between a) the sealing compound and b) the substrate and the elements adhesively attached underneath is significantly improved. Both the bottom surface of the sealing compound and the top surface of the elements may be plasma treated. With this, adhesion between the elements and the sealing compound is significantly improved. As a result, the reliability of elements is improved due to reduced effects from thermal stress and humidity.

The present invention according to another aspect provides a semiconductor apparatus comprising: a substrate; elements provided on the substrate; and a sealing compound provided on the substrate and sealing the elements, wherein the elements and the sealing compound are brought into contact with each other, and surfaces of the elements in contact with the sealing compound are plasma treated. With this, the top surfaces of the elements are plasma treated so that adhesion with the sealing compound adhesively attached on top thereof is significantly improved. As a result, the reliability of elements is improved due to reduced effects from thermal stress and humidity.

The present invention according to still another aspect provides a semiconductor apparatus comprising: a substrate; an adhesive compound provided on the substrate; and semiconductor chips provided on the adhesive compound, wherein the adhesive compound and the semiconductor chips are brought into contact with each other, and surfaces of the semiconductor chips in contact with the adhesive compound are plasma treated.

The present invention according to yet another aspect provides a semiconductor apparatus comprising: a substrate; a first semiconductor chip provided on the substrate; an adhesive compound provided on the first semiconductor chip; and a second semiconductor chip provided on the adhesive compound, wherein the adhesive compound and the second semiconductor chip are brought into contact with each other, and a surface of the second semiconductor chip in contact with the adhesive compound is plasma treated.

With this, the bottom surfaces of the semiconductor chips are plasma treated so that adhesion with the substrate adhesively attached underneath is significantly improved. As a result, the reliability of elements is improved due to reduced effects from thermal stress and humidity. Since the face of the semiconductor chip which is not an element-bearing surface is plasma treated, the elements formed are not affected by plasma treatment and the reliability of elements is improved. In further accordance with this aspect, strong adhesion is achieved since the adhesive compound is directly brought into contact with the surface cleaned by plasma treatment.

The present invention according to another aspect provides a method of fabricating a semiconductor apparatus comprising a substrate, elements provided on the substrate and a sealing compound provided on the substrate and sealing the elements, the method comprising the steps of: subjecting a surface of the sealing compound to plasma treatment, and adhesively attaching the surface subjected to plasma treatment to the substrate or the elements. The method may further include a step of subjecting a surface of each of the elements to plasma treatment.

The present invention according to still another aspect provides a method of fabricating a semiconductor apparatus comprising a substrate, elements provided on the substrate and a sealing compound provided on the substrate and sealing the elements, the method comprising the steps of: subjecting a surface of each of the elements to plasma treatment; and adhesively attaching the surface subjected to plasma treatment to the sealing compound.

The present invention according to yet another aspect provides a method of fabricating a semiconductor apparatus comprising a substrate, an adhesive compound provided on the substrate and semiconductor chips provided on the adhesive compound, comprising the steps of: subjecting a surface of each of the elements to plasma treatment; providing the sealing compound on the surface subjected to plasma treatment; and adhesively attaching the substrate to the semiconductor chips via the adhesive compound. The substrate may be a release film.

The present invention according to another aspect provides a method of fabricating a semiconductor apparatus comprising a substrate, a first semiconductor chip provided on the substrate, an adhesive compound provided on the first semiconductor chip and a second semiconductor chip provided on the adhesive compound, the method comprising the steps of: subjecting a surface of the second semiconductor chip to plasma treatment; providing the adhesive compound on the surface subjected to plasma treatment; and adhesively attaching the second semiconductor chip to the first semiconductor chip via the adhesive compound. The substrate may be a release film.

Also, the substrate is generic to a semiconductor chip, a semiconductor wafer and a resin film formed on a substrate. More specifically, according to the present invention, the top surface of the substrate may be brought into contact with the surfaces of the elements or the semiconductor chips subjected to plasma treatment. Alternatively, the top surface of a protective film provided on the uppermost layer of the substrate may be brought into contact with the surfaces of the elements or the semiconductor chips subjected to plasma treatment. The elements are generic to semiconductor elements such as semiconductor chips, and passive elements such as resistors, capacitors and conductors. In plasma treatment, a plasma gas including an inactive gas is preferably used. With this, degradation in the performance of substrate is controlled and the surface providing excellent interface adhesion is obtained.

BRIEF DESCRIPTION OF THE DRAWINGS

FIG. 14 is a chart showing results of measurement in an experiment

FIG. 15 is a chart showing results of measurement in the experiment.

DETAILED DESCRIPTION OF THE INVENTION

First Embodiment

Figure 1A:
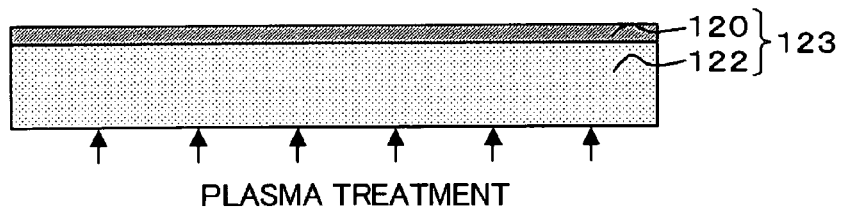
FIGS. 1A-1D illustrate the method of fabricating a semiconductor apparatus according to a first embodiment of the present invention.

FIGS. 1A-1D are sections illustrating a process of fabricating a semiconductor apparatus according to a first embodiment of the present invention. As shown in FIG. 1A, the bottom surface of a composite of conductive film and resin insulating film 123 comprising a conductive film 120 and a resin insulating film 122 is plasma treated. The conductive film 120 may be a rolled metal such as a rolled copper foil. Any material may be used to form the resin insulating film 122 as long as it is softened by heating. For example, epoxy resin, melamine derivatives such as BT resin, liquid crystal polymer, PPE resin, polyimide resin, fluororesin, phenol resin, polyamide bismaleimide may be used. In addition to the resin, a filler or an additive such as $SiO_2$ may be added as appropriate.

The plasma irradiation condition is set to adapt to the resin material used so that surface properties superior in interface adhesion are obtained. For example, the condition may be established such that an inactive gas like argon is included in a plasma gas so as to improve the efficiency with which organic substance collected on the bottom surface of the resin insulating film 122 is removed. With this, the efficiency in removing organic substance collected on the bottom surface of the resin insulating film 122 is improved. Other inactive gases such as a nitrogen gas or a rare gas may be used instead of argon.

In the embodiment, the following condition is employed.
Plasma gas: Argon 10-20 sccm
Bias (W): 100
RF power (W): 500
Pressure (Pa): 20
Processing time (sec): 20

Figure 1B:
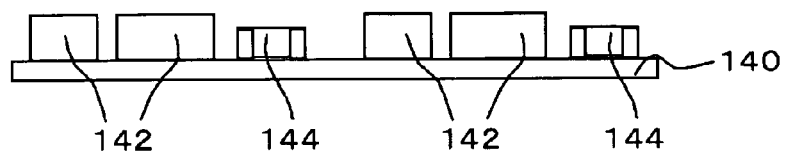

Subsequently, as shown in FIG. 1B, circuit elements including a plurality of semiconductor elements 142 and a plurality of passive elements 144 are fixed to a substrate 140. The substrate 140 is adhesive and may be a tape substrate on which the semiconductor elements 142 and the passive elements 144 are fixed. A PET film, polypropylene (PP), polyamide (PA), polyethylen (PE) may be used as such a material. The semiconductor elements 142 are, for example, transistors, diodes, IC chips and the like. The passive elements 144 are, for example, chip capacitors and chip resistors.

Figure 1C:
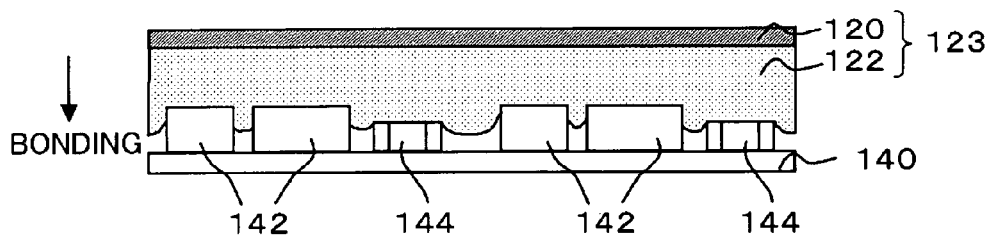
Figure 1D:
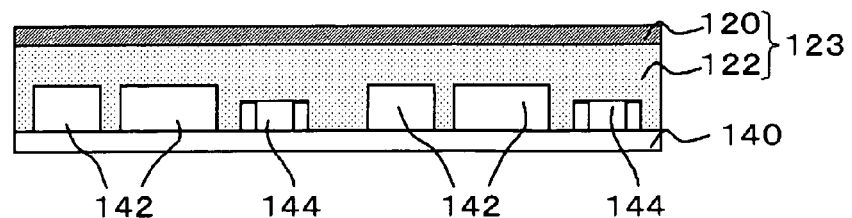

As shown in FIG. 1C, the composite of conductive film and resin insulating film 123 comprising the conductive film 120 and the plasma treated resin insulating film 122 is placed on the substrate 140, in a state in which the plurality of semiconductor elements 142 and the plurality of passive elements 144 are fixed. The composite of conductive film and resin insulating film 123 is brought into contact with the substrate 140 so that the semiconductor elements 142 and the passive elements 144 are laid in the resin insulating film 122. Subsequently, the resin insulating film 122 is heated in a vacuum or under a reduced pressure and is bonded to the substrate 140. As shown in FIG. 1D, this allows the semiconductor elements 142 and the passive elements 144 to be embedded in the resin insulating film 122 so that the semiconductor elements 142 and the passive elements 144 are bonded inside the resin insulating film 122.

The semiconductor apparatus comprises the substrate 140, the semiconductor elements 142 and the passive elements 144 fixed on the substrate 140, and the composite of conductive film and resin insulating film 123. The composite of conductive film and resin insulating film 123 comprises the conductive film 120 and the resin insulating film 122 the bottom surface of which is plasma treated. The semiconductor elements 142 and the passive elements 144 are embedded in the resin insulating film 122 so that the semiconductor elements 142 and the passive elements 144 are bonded inside the composite of conductive film and resin insulating film 123. Since the bottom surface of the resin insulating film 122 is plasma treated, adhesion between a) the resin insulating film 122 and b) the substrate 140, the semiconductor elements 142 and the passive elements 144 is improved.

In this embodiment, by plasma treating the bottom surface of the resin insulating film 122, the bottom surface of the resin insulating film 122 is cleaned because organic substance collected on the bottom surface is removed. Additionally, minute projections are produced on the bottom surface of the resin insulating film 122. Thus, the surface of the film is reformed to provide excellent adhesion. Accordingly, adhesion between a) the resin insulating film 122 and b) the substrate 140 bonded underneath the resin insulating film 122, and the circuit elements including the plurality of semiconductor elements 142 and the plurality of passive elements 144, which are also bonded underneath the resin insulating film 122, is improved. As a result of this, the reliability of elements in the semiconductor apparatus is improved.

Second Embodiment

In the first embodiment, the bottom surface of the resin insulating film 122 is described as being plasma treated. In a second embodiment according to the present invention, a description will be given of the structure in which the top surface of each of the substrate 140, the semiconductor elements 142 and the passive elements 144 is plasma treated.

Figure 2A:
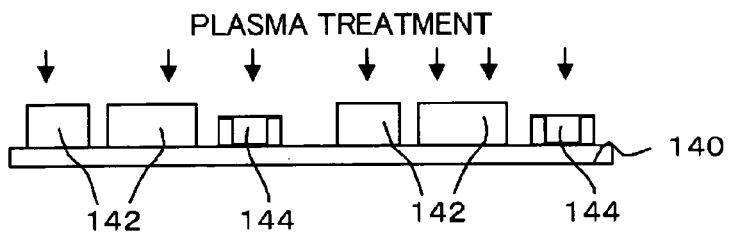
FIGS. 2A-2D illustrate the method of fabricating a semiconductor apparatus according to a second embodiment of the present invention.

As shown in FIG. 2A, the top surface of each of the substrate 140, and the circuit elements, including the plurality of semiconductor elements 142 and the plurality of passive elements 144 fixed on the substrate 140 is plasma treated. The plasma irradiation condition is set to adapt to the resin material used so that surface properties superior in interface adhesion are obtained. For example, the condition may be established such that an inactive gas like argon is included in a plasma gas so as to improve the efficiency with which organic substance, collected on the top surface of the circuit elements including the plurality of semiconductor elements 142 and the plurality of passive elements 144 fixed on the substrate 140, is removed. With this, the efficiency in removing organic substance, collected on the top surface of the circuit elements including the plurality of semiconductor elements 142 and the plurality of passive elements 144 fixed on the substrate 140, is improved. Inactive gases such as a nitrogen gas or a rare gas may be used instead of argon.

In the embodiment, the following condition is employed.
Plasma gas: Argon 10-20 sccm
Bias (W): not applied
RF power (W): 500
Pressure (Pa): 20
Processing time (sec): 20

Figure 2B:
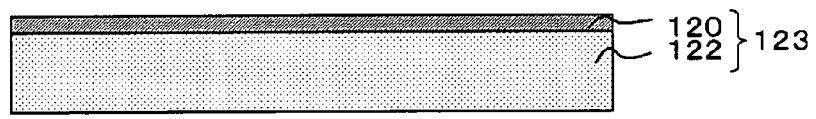
Figure 2B:
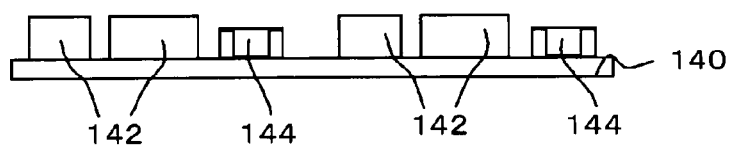

The plasma treatment result is as shown in FIG. 2B. The composite of conductive film and resin insulating film 123 comprising the conductive film 120 and the resin insulating film 122 is placed on the substrate 140, in a state in which the substrate 140, the plurality of semiconductor elements 142 and the plurality of passive elements 144, which are plasma treated, are fixed.

Figure 2C:
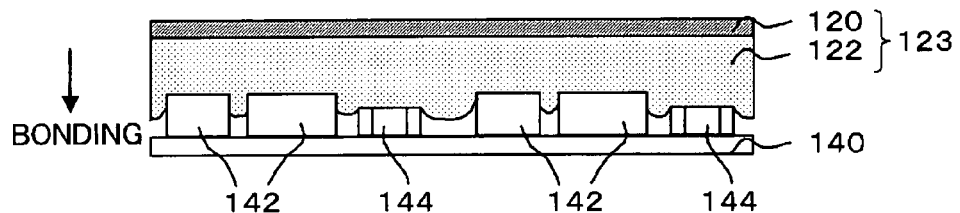
Figure 2D:
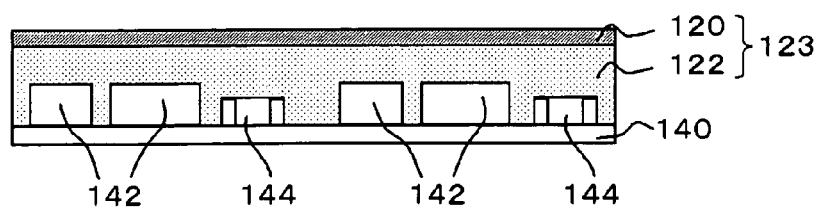

Subsequently, as shown in FIG. 2C, the composite of conductive film and resin insulating film 123 is brought into contact with the substrate 140 and the semiconductor elements 142 and the passive elements 144 are laid in the resin insulating film 122. Subsequently, the resin insulating film 122 heated in a vacuum or under a reduced pressure and is bonded to the substrate 140. As shown in FIG. 2D, this allows the semiconductor elements 142 and the passive elements 144 to be embedded in the resin insulating film 122 so that the semiconductor elements 142 and the passive elements 144 are bonded inside the resin insulating film 122.

The semiconductor apparatus comprises the plasma treated substrate 140, the semiconductor elements 142 and the passive elements 144 also plasma treated and fixed on the substrate 140, and the composite of conductive film and resin insulating film 123. The composite of conductive film and resin insulating film 123 comprises the conductive film 120 and the resin insulating film 122. The semiconductor elements 142 and the passive elements 144 are embedded in the resin insulating film 122 so that the semiconductor elements 142 and the passive elements 144 are bonded inside the composite of conductive film and resin insulating film 123. Accordingly, adhesion between a) the top surface of the substrate 140, the plurality of semiconductor elements 142 and the plurality of passive elements 144, which are plasma treated, and b) the resin insulating film 122 is improved.

In this embodiment, by plasma treating the top surface of each of the substrate 140 and the circuit elements including the plurality of semiconductor elements 142 and the plurality of passive elements 144 fixed on the substrate, minute projections are produced on the top surface of the substrate 140. Additionally, the top surface of each of the circuit elements including the plurality of semiconductor elements 142 and the plurality of -passive elements 144 is cleaned because organic substance collected on the top surface of each of the circuit elements is removed. As a result, the top surface of each of the circuit elements is reformed to provide excellent adhesion. In this way, adhesion between a) the top surface of the substrate 140 and the top surface of each of the circuit elements including the plurality of semiconductor elements 142 and the plurality of passive elements 144 and b) the bottom surface of the resin insulating film 122 bonded on top of the circuit elements is improved. As a result of this, the reliability of elements in the semiconductor apparatus is improved.

Third Embodiment

Unlike the first embodiment and the second embodiment, a third embodiment of the present invention uses an elastic material as the substrate 140. A PET film, polypropylene (PP), polyamide (PA), polyethylen (PE) may be used to form the substrate 140 according to the third embodiment.

Figure 3A:
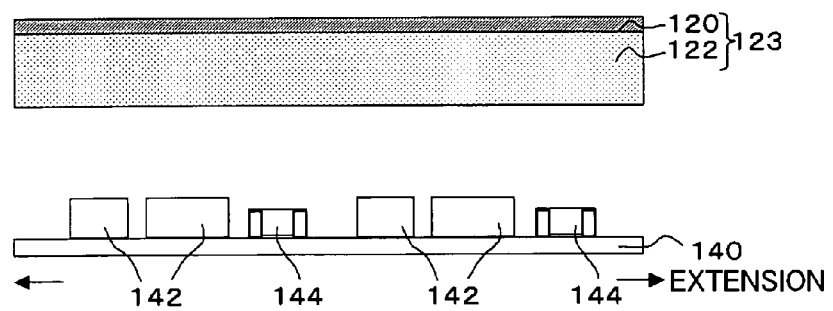
FIGS. 3A-3C illustrate the method of fabricating a semiconductor apparatus according to a third embodiment of the present invention.
Figure 3B:
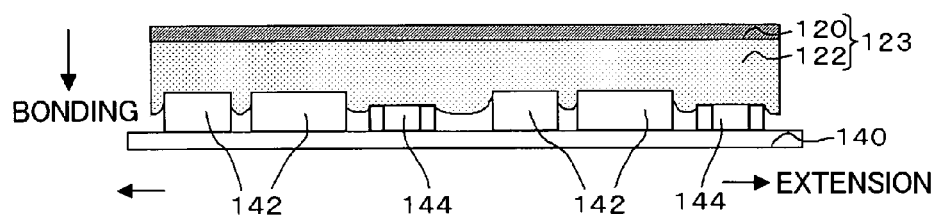
Figure 3C:
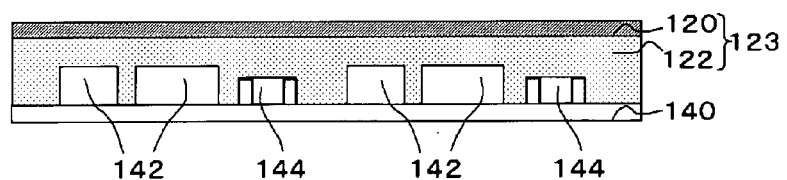
Figure 4A:
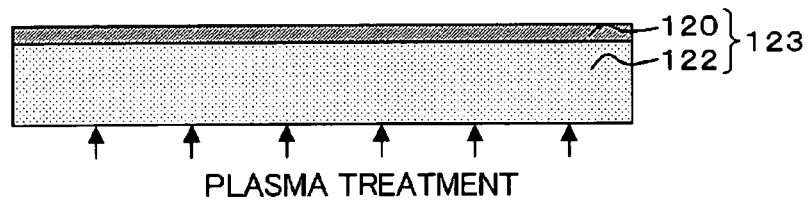
FIGS. 4A-4C illustrate the method of fabricating a semiconductor apparatus according to an alternative embodiment of the present invention.
Figure 4B:
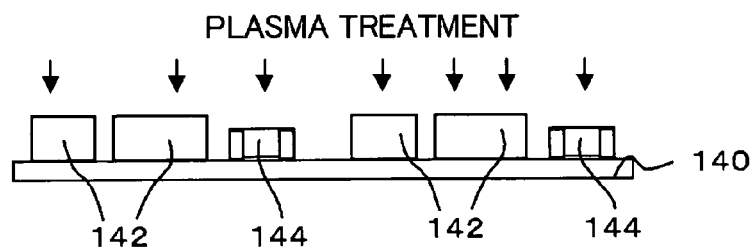
Figure 4C:
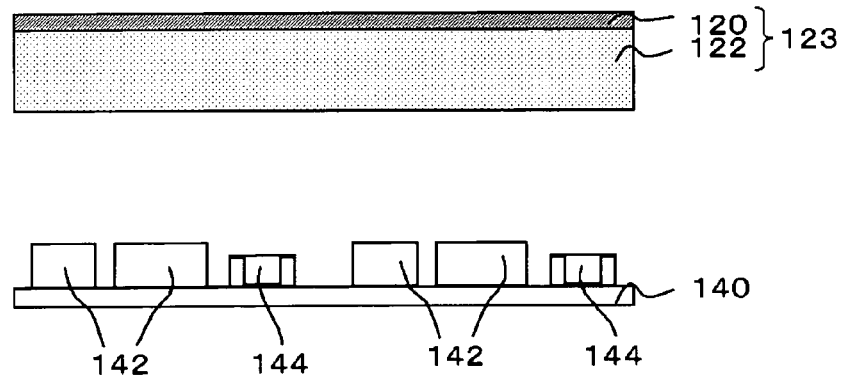
Figure 5A:
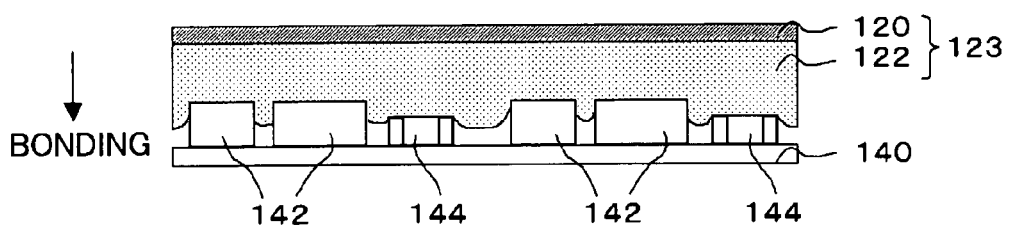
FIGS. 5A-5B illustrate the method of fabricating a semiconductor apparatus according to an alternative embodiment of the present invention.
Figure 5B:
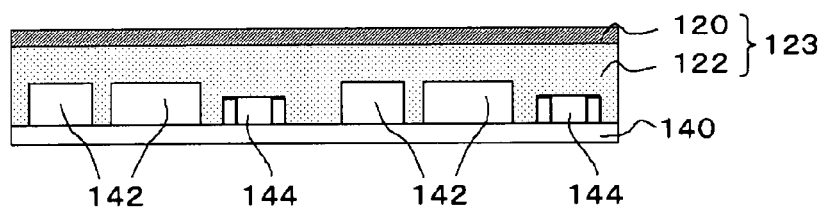
Figure 6:
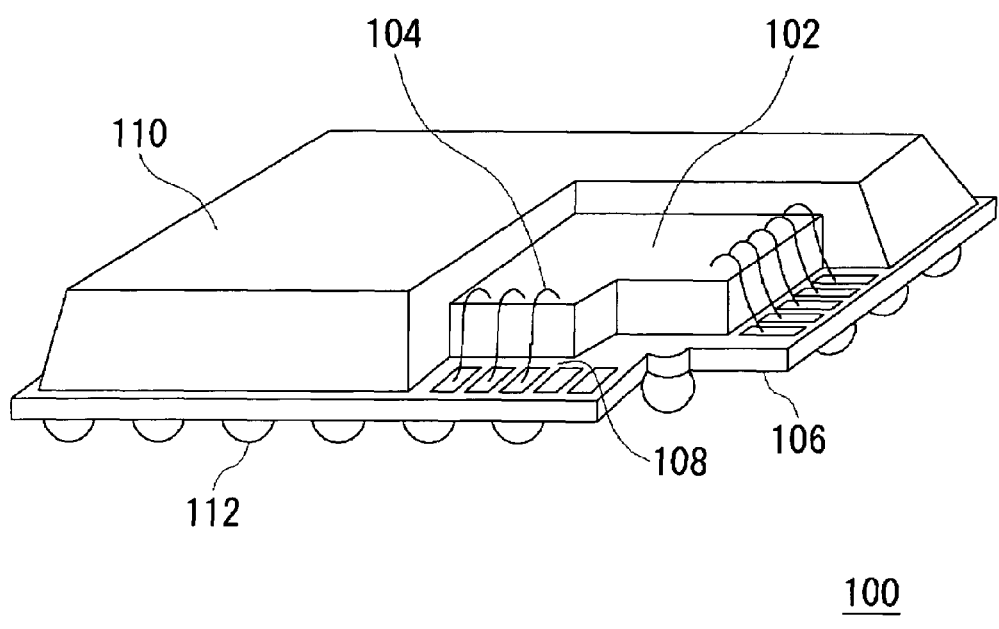
FIG. 6 is a schematic illustration of the structure of a BGA generally used.
Figure 7:
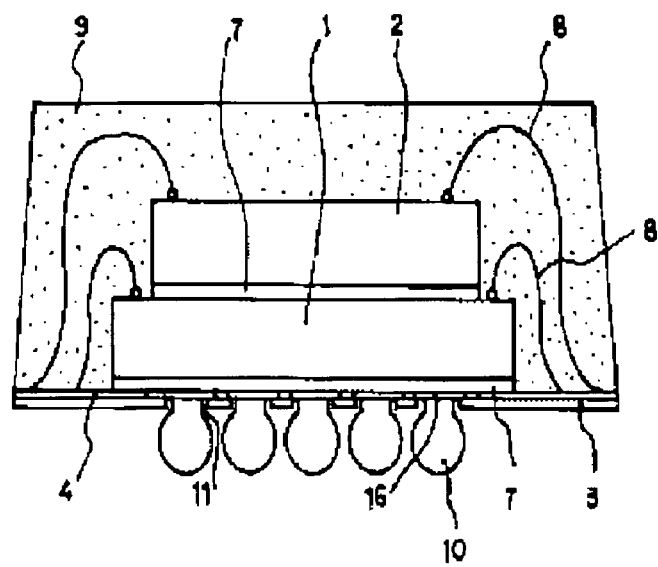
FIG. 7 illustrates the structure of a package in which a plurality of semiconductor packages are built in layers.

FIGS. 3A-3C are sections illustrating a process of fabricating a semiconductor apparatus according to the third embodiment. As shown in FIG. 3A, after fixing the plurality of semiconductor elements 142 and the plurality of passive elements 144 on the substrate 140, the substrate 140 is extended horizontally as illustrated. The substrate 140 is extended by clamping the ends of the substrate 140 by a fastening device and extending the substrate 140 horizontally as illustrated. As shown in FIG. 3B, the composite of conductive film and resin insulating film 123 plasma treated in a condition similar to that of the first embodiment is placed on the substrate 140, in a state in which the substrate 140 is extended horizontally as illustrated. The plurality of semiconductor elements 142 and the plurality of passive elements 144 are brought into contact with the resin insulating film 122, so that the semiconductor elements 142 and the passive elements 144 are laid in the resin insulating film 122. By removing the fastening device from the substrate 140, the force that has maintained the substrate 140 extended is removed. The resin insulating film 122 is then heated in a vacuum or in a reduced pressure and is bonded to the substrate 140. As shown in FIG. 3C, this allows the semiconductor elements 142 and the passive elements 144 to be embedded in the resin insulating film 122 so that the semiconductor elements 142 and the passive elements 144 are bonded inside the resin insulating film 122.

By laying the semiconductor elements 142 and the passive elements 144 in the resin insulating film 122 in a state in which the substrate 140 on which the semiconductor elements 142 and the passive elements 144 are fixed is extended, relatively large intervals between the elements is secured in the process of laying. Therefore, the resin insulating film 122 is easily introduced into areas between the elements. Consequently, adhesion between a) the semiconductor elements 142 and the passive elements 144 and b) the plasma treated resin insulating film 122 is improved so that the reliability of elements in the semiconductor apparatus is improved.

In the third embodiment, the composite of conductive film and resin insulating film 123 is described as being plasma treated The substrate 140, the plurality of semiconductor elements 142 and the plurality of passive elements 144 may also be plasma treated in a condition similar to that of the second embodiment.

In the process of bonding the substrate 140 on which the semiconductor elements 142 and the passive elements 144 are fixed with the composite of conductive film and resin insulating film 123, a support member may be used. With this, adhesion between a) the circuit elements including the semiconductor elements 142 and the passive elements 144 and b) the resin insulating film 122 is improved so that the reliability of elements in the semiconductor apparatus is improved.

The resin insulating film 122 is described above as being composed of a single film. Alternatively, it may be composed of a laminate of two films. The films in the laminate may be of the same material or different materials.

As illustrated in FIGS. 4A through 4C and FIGS. 5A through 5B, the resin insulating film 122 which is plasma treated in a condition similar to that of the first embodiment may be bonded with the semiconductor elements 142 and the passive elements 144 plasma treated in a condition similar to that of the second embodiment. With this, adhesion between a) the circuit elements including the semiconductor elements 142 and the passive elements 144 and b) the resin insulating film 122 is improved so that the reliability of elements in the semiconductor apparatus is improved.

The described embodiment assumes the use of the resin insulating film 122 provided with the conductive film 120 on the top surface thereof. Alternatively, the resin insulating film without the conductive film 120 may be used.

Fourth Embodiment

Figure 8A:
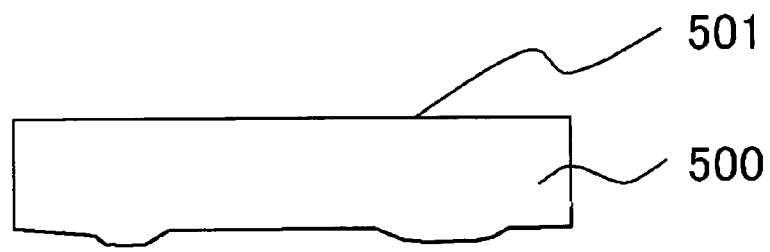
FIGS. 8A-8D illustrate the method of fabricating a semiconductor apparatus according to a fourth embodiment of the present invention.
Figure 8B:
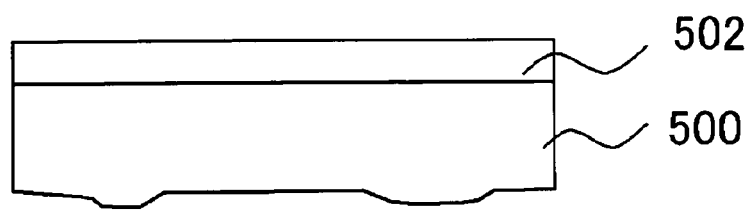
Figure 8C:
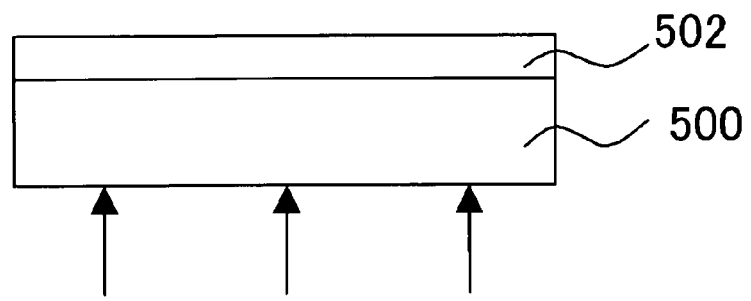
Figure 8D:
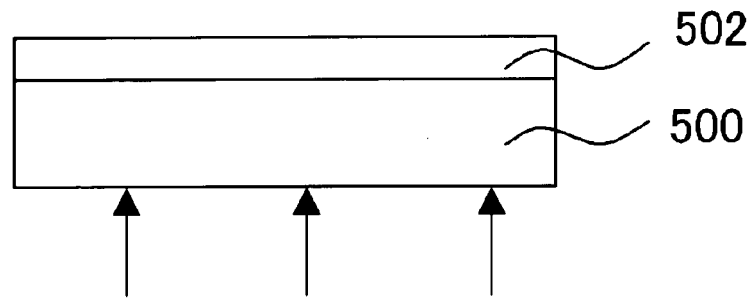

FIGS. 8A-8D and 9A-9C illustrate a process of fabricating a semiconductor chip according to a fourth embodiment of the present invention. FIG. 8A illustrates a semiconductor wafer 500. The top face thereof is an element-bearing surface 501 that carries elements. As illustrated in FIG. 8B, an element layer 502 is formed on top of the element-bearing surface 501. As illustrated in FIG. 8C, the back surface of the semiconductor wafer is then polished into flatness and rinsed by pure water. As illustrated in FIG. 8D, the back surface of the semiconductor wafer 500 polished and rinsed is plasma treated. The plasma irradiation condition is set so that surface properties superior in interface adhesion are obtained. For example, the condition may be established such that an inactive gas like argon is included in a plasma gas so as to improve the efficiency with which organic substance collected on the back surface of the semiconductor wafer is removed. With this, the efficiency in removing organic substance collected on the back surface of the semiconductor wafer is improved. Other inactive gases such as a nitrogen gas or a rare gas may be used instead of argon. An oxidizing gas such as oxygen may be mixed with the gas.

In the embodiment, the following condition is employed.
Plasma gas: Argon 10-20 sccm, Oxygen 0-10 sccm
Bias (W): not applied
RF power (W): 500
Pressure (Pa): 20
Processing time (sec): 20

As a result of plasma treating, the back surface of the semiconductor wafer 500 is cleaned because organic substance collected on the back surface is removed. Additionally, the back surface is reformed to provide excellent adhesion. Consequently, adhesion between a) the back surface and b) semiconductor chips and a solder resist layer formed underneath is improved.

Figure 9A:
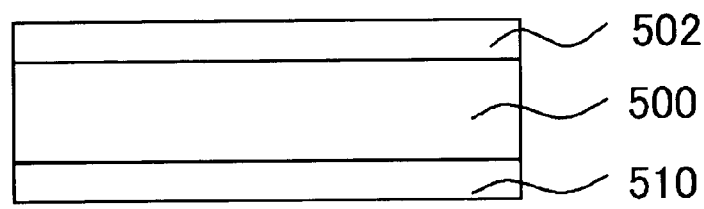
FIGS. 9A-9C illustrate the method of fabricating a semiconductor apparatus according to the fourth embodiment of the present invention.
Figure 9B:
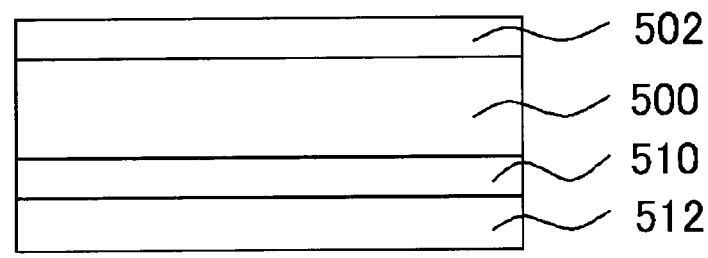
Figure 9C:
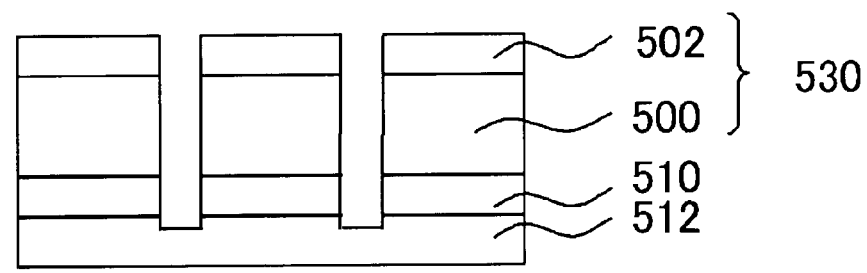

As illustrated in FIG. 9A, an adhesive layer 510 is then pasted to the back surface of the semiconductor wafer 500 reformed to provide excellent adhesion. Further, as illustrated in FIG. 9B, a dicing sheet 512 is adhesively attached to the bottom surface of the adhesive layer 510. Dicing is performed as shown in FIG. 9C so that a semiconductor chip 530 provided with the adhesive layer 510 and the dicing sheet 512 is fabricated. The dicing sheet may not be used in this embodiment. For example, the dicing may be performed on the substrate.

Figure 10:
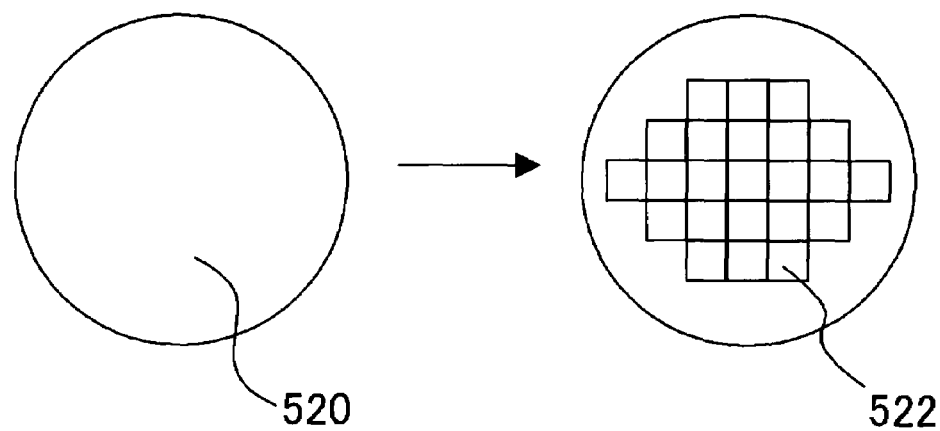
FIG. 10 illustrates the method of fabricating a semiconductor apparatus according to an alternative embodiment of the present invention.

FIG. 10 is a top view illustrating a step in the process of fabricating a semiconductor chip. A semiconductor wafer 520 having the back surface thereof polished, rinsed and the plasma treated is diced into the size of semiconductor chips 522.

Figure 11:
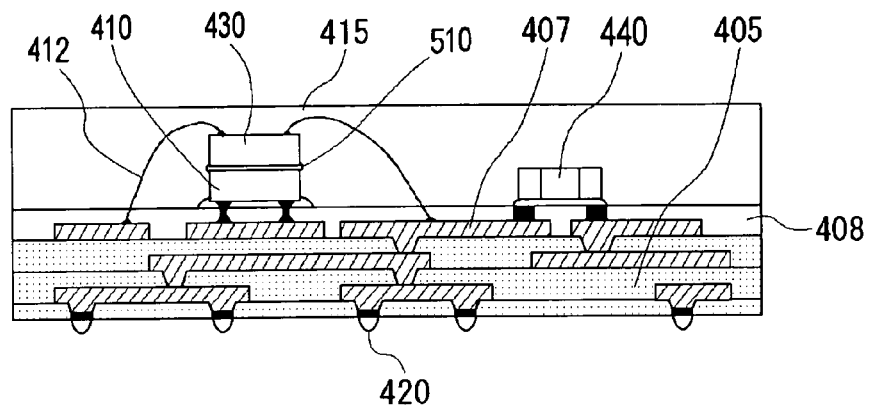
FIG. 11 illustrates the structure of a semiconductor apparatus according to an alternative embodiment of the present invention.

FIG. 11 is a section illustrating the structure in which a first semiconductor chip 410 and a second semiconductor chip 430 adhesively attached to each other via the adhesive layer 510 is built on a solder resist layer 408. This semiconductor apparatus comprises a multi-layer interconnect structure, the first semiconductor chip 410, the second semiconductor chip 430, wires 412 and circuit elements 440, where the first semiconductor chip 410, the second semiconductor chip 430, the wires 412 and the circuit elements 440 are formed on the surface of the multi-layer interconnect structure. The multi-layer interconnect structure is constructed such that the solder resist layer 408 is formed on the uppermost layer, and a stack of a plurality of interconnect layers, each comprising an interlayer insulating film 405 and an interconnect 407 formed of copper, is built. Solder balls 420 are provided on the back surface of the multi-layer interconnect structure. The first semiconductor chip 410 and the interconnect 407 are connected to each other by a solder. The second semiconductor chip 430 and the interconnect 407 are connected to each other by the wire 412.

The first semiconductor chip 410, the second semiconductor chip 430 and the circuit elements 440 are molded by a molding resin 415. Molding of a plurality of modules of semiconductor elements is done simultaneously using a die. The molding process is achieved by transfer molding, injection molding, potting or dipping. A thermosetting resin such as epoxy resin is used in transfer molding or potting. A thermoplastic resin such as polyimide resin and polyphenylene sulfide may be used in injection molding.

The first semiconductor chip 410, and the second semiconductor chip 430 using the semiconductor chip 530 diced in the process as described above are adhesively attached to each other via the adhesive layer 510. The second semiconductor chip 430 corresponds to the semiconductor chip 530 fabricated in the method described above. The bottom surface of the second semiconductor chip 430 is plasma treated. The plasma treated surface is covered by the adhesive layer 510. When the second semiconductor chip 430 is adhesively attached to the first semiconductor chip 410, the dicing sheet 512 is peeled off so that the exposed surface is adhesively attached to the first semiconductor chip 410. The adhesive layer 510 and the top surface of the first semiconductor chip 410 are adhesively attached to each other in a state in which the bottom surface of the second semiconductor chip 430 remains covered by the adhesive layer 510. Therefore, the bottom surface of the second semiconductor chip 430 remains fresh from the plasma treatment. Since the plasma treated surface is not an element-bearing surface, elements are not affected by plasma. Adhesion at the interface between the first semiconductor chip 410 and the second semiconductor chip 430 remains excellent so that the yield of semiconductor apparatus and the reliability of elements are improved.

The solder resist layer 408, the interlayer insulating film 405 and the molding resin 415 may be formed of materials independent from each other. For example, a melamine derivative such as a BT resin, liquid crystal polymer, epoxy resin, PPE resin, polyimide resin, fluororesin, phenol resin and a thermosetting resin such as polyamide bismaleimide may be used. Of these, liquid crystal polymer, epoxy resin and a melamine derivative such as BT resin are suitably used due to their excellent high-frequency characteristics. A filler such as $SiO_2$ or an additive may be added in addition to the resin.

The adhesive layer 510 may be a layer formed of a die attach film or a layer formed by application of die attach paste. When a die attach film is used to form the adhesive layer 510, the adhesive layer 510 is formed by pasting the die attach film on the back surface of the semiconductor wafer 500 in the step illustrated in FIG. 9A. Subsequently, the dicing sheet 512 is pasted on the die attach film. When die attach paste is used as the adhesive layer 510, the adhesive layer 510 is formed by pasting die attach paste on the back surface of the semiconductor wafer 500 in the step illustrated in FIG. 9A. Subsequently, the dicing sheet 512 is pasted on the die attach paste.

Epoxy resin, BT resin, liquid crystal polymer or the like may be used to form the insulating substrate. By using a resin as listed, a semiconductor apparatus which is superior in high-frequency characteristics and product reliability is obtained.

In the step of FIG. 8D, the surface of the semiconductor chip 430 in this semiconductor apparatus is reformed by plasma treatment to provide excellent adhesion to the adhesive layer 510. With this, interface adhesion between the first semiconductor chip 410 and the second semiconductor chip 430 above is significantly improved so that the yield of semiconductor apparatus and the reliability of elements are improved.

In the process of adhesively attaching the first semiconductor chip 410 and the second semiconductor chip 430 to each other via the adhesive layer 510, the surface of the first semiconductor chip 410 brought into contact with the second semiconductor chip 430 may be plasma treated. With this process, the elements of the first semiconductor chip 410 are affected by the plasma treatment. The benefit is that the surface of the first semiconductor chip 410 s reformed to provide excellent adhesion with the adhesive layer 510. Therefore, interface adhesion between the first semiconductor chip 410 and the second semiconductor chip 430 is significantly improved so that the yield of semiconductor apparatus is improved.

Fifth Embodiment

Figure 12:
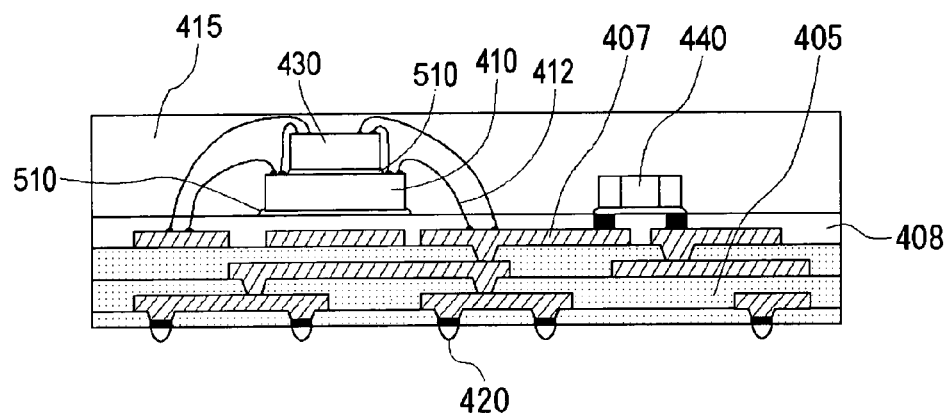
FIG. 12 illustrates the structure of a semiconductor apparatus according to a fifth embodiment of the present invention.

FIG. 12 is a section of the structure in which the bottom surface of the first semiconductor chip 410, which is adhesively attached to the second semiconductor chip 430 via the adhesively layer 510, is adhesively attached to the solder resist layer 408 via the adhesive layer 510. This semiconductor apparatus comprises a multi-layer interconnect structure, the first semiconductor chip 410, the second semiconductor chip 430, wires 412 and circuit elements 440, where the first semiconductor chip 410, the second semiconductor chip 430, the wires 412 and the circuit elements 440 are formed on the surface of the multi-layer interconnect structure. The multi-layer interconnect structure is constructed such that the solder resist layer 408 is formed on the uppermost layer, and a stack of a plurality of interconnect layers, each comprising an interlayer insulating film 405 and an interconnect 407 formed of copper, is built. Solder balls 420 are provided on the back surface of the multi-layer interconnect structure. The wire 412 connects between the first semiconductor chip 410 and the second semiconductor chip 430, between the first semiconductor chip 410 and the interconnect 407, and between the second semiconductor chip 430 and the interconnect 407.

The first semiconductor chip 410, the second semiconductor chip 430 and the circuit elements 440 are molded by a molding resin 415. Molding of a plurality of modules of semiconductor elements is done simultaneously using a die. The molding process is achieved by transfer molding, injection molding, potting or dipping. A thermosetting resin such as epoxy resin is used in transfer molding or potting. A thermoplastic resin such as polyimide resin and polyphenylene sulfide may be used in injection molding.

The first semiconductor chip 410 and the second semiconductor chip 430 correspond to the semiconductor chip 530 fabricated in the method described above. The bottom surfaces of the first semiconductor chip 410 and the second semiconductor chip 430 is plasma treated. The plasma treated surfaces are covered by the adhesive layer 510. When the second semiconductor chip 430 is adhesively attached to the first semiconductor chip 410, and when the first semiconductor chip 410 is adhesively attached to the solder resist layer 408, the dicing sheet 512 is peeled off so that the exposed surface of the second semiconductor chip 430 is adhesively attached to the first semiconductor chip 410, and the exposed surface of the first semiconductor chip 410 is adhesively attached to the solder resist layer 408, respectively. The adhesive layer 510 and the top surface of the first semiconductor chip 410 is adhesively attached to each other in a state in which the bottom surface of the second semiconductor chip 430 remains covered by the adhesive layer 510. Therefore, the bottom surface of the second semiconductor chip 430 remains fresh from the plasma treatment. Similarly, the adhesive layer 510 and the solder resist layer 408 are adhesively attached to each other in a state in which the bottom surface of the first semiconductor chip 410 remains covered by the adhesive layer 510. Therefore, the bottom surface of the first semiconductor chip 410 remains fresh from the plasma treatment. Since the plasma treated surface is not an element-bearing surface, elements are not affected by plasma. Adhesion at the interface between the first semiconductor chip 410 and the second semiconductor chip 430 and adhesion at the interface between the first semiconductor chip 410 and the solder resist layer 408 remain excellent so that the yield of semiconductor apparatus and the reliability of elements are improved.

The solder resist layer 408, the interlayer insulating film 405 and the molded resin 415 may be formed of materials independent from each other. For example, a melamine derivative such as a BT resin, liquid crystal polymer, epoxy resin, PPE resin, polyimide resin, fluororesin, phenol resin and a thermosetting resin such as polyamide bismaleimide may be used. Of these, liquid crystal polymer, epoxy resin and a melamine derivative such as BT resin are suitably used due to their excellent high-frequency characteristics. A filler such as $SiO_2$ or an additive may be added in addition to the resin.

The adhesive layer 510 may be a layer formed of a die attach film or a layer formed by application of die attach paste. When a die attach film is used to form the adhesive layer 510, the adhesive layer 510 is formed by pasting the die attach film on the back surface of the semiconductor wafer 500 in the step illustrated in FIG. 9A. Subsequently, the dicing sheet 512 is pasted on the die attach film. When die attach paste is used as the adhesive layer 510, the adhesive layer 510 is formed by pasting die attach, paste on the back surface of the semiconductor wafer 500 in the step illustrated in FIG. 9A. Subsequently, the dicing sheet 512 is pasted on the die attach paste.

Epoxy resin, BT resin, liquid crystal polymer or the like may be used to form the insulating substrate. By using a resin as listed, a semiconductor apparatus which is superior in high-frequency characteristics and product reliability is obtained.

In the step of FIG. 8D, the surfaces of the first semiconductor chip 410 and the second semiconductor chip 430 corresponding to the semiconductor chip 530 are reformed by plasma treatment to provide excellent adhesion to the adhesive layer 510. With this, interface adhesion between the solder resist layer 408 and the first semiconductor chip 410 and interface adhesion between the first semiconductor chip 410 and the second semiconductor chip 430 are significantly improved so that the yield of semiconductor apparatus and the reliability of elements are improved.

As in the fourth embodiment, In the process of adhesively attaching the first semiconductor chip 410 and the second semiconductor chip 430 to each other via the adhesive layer 510, the surface of the first semiconductor chip 410 brought into contact with the second semiconductor chip 430 may be plasma treated. In this process, the elements of the first semiconductor chip 410 are affected by plasma. The benefit is that the surface of the first semiconductor chip 410 is reformed to provide excellent adhesion with the adhesive layer 510. Therefore, interface adhesion between the first semiconductor chip 410 and the second semiconductor chip 430 is significantly improved so that the yield of semiconductor apparatus is improved.

Figure 13:
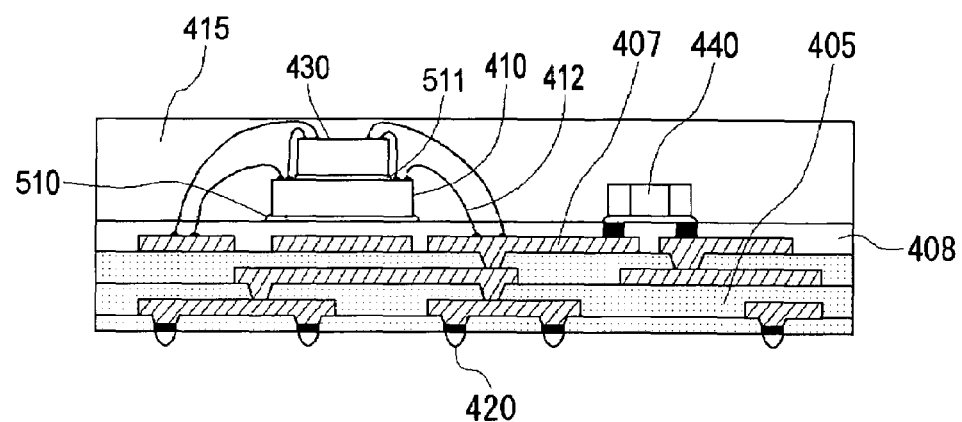
FIG. 13 illustrates the structure of a semiconductor apparatus according to an alternative embodiment of the present invention.

As illustrated in FIG. 13, instead of adhesion via the adhesive layer 510, the bottom surface of the second semiconductor chip 430 and the top surface of the first semiconductor chip 410 may be brought into contact with each other via a contact layer 511, and the first semiconductor chip 410 may be adhesively attached to the solder resist layer 408 via the adhesive layer 510. The first semiconductor chip 410 corresponds to the semiconductor chip 530 fabricated in the method described above.

Alternatively, the first semiconductor chip 410 alone may be adhesively attached to the solder resist layer 408 via the adhesive layer 510. The first semiconductor chip 410 corresponds to the semiconductor chip 530 fabricated in the method described above. The bottom surface of the first semiconductor chip 410 is plasma treated. The plasma treated surface is covered by the adhesive layer 510. When the first semiconductor chip 410 is adhesively attached to the solder resist layer 408, the dicing sheet 512 is peeled off so that the exposed surface is adhesively attached to the solder resist layer 408. The adhesive layer 510 and the top surface of the solder resist layer 408 are adhesively attached to each other in a state in which the bottom surface of the first semiconductor chip 410 remains covered by the adhesive layer 510. Therefore, the bottom surface of the first semiconductor chip 410 remains fresh from the plasma treatment. Since the plasma treated surface is not an element-bearing surface, elements are not affected by plasma. Adhesion at the interface between the first semiconductor chip 410 and the solder resist layer 408 remains excellent so that the yield of semiconductor apparatus and the reliability of elements are improved.

Experiment 1

In this experiment, the coverage of carbon, oxygen, nitrogen and silicon on the back surface of the wafer subjected to Ar plasma treatment was measured by X-ray photoelectron spectroscopy using PHI Quantera SXM. Silicon is used to form the wafer. Ar plasma treatment is applied to a ground and rinsed surface. To ensure accuracy of the measurement, two wafers including a wafer A and a wafer B are prepared. Each of the wafers is subject to the treatment for measurement.

The Ar plasma treatment condition was such that argon: 10 sccm, bias: not applied, RF power: 500 (W), pressure: 20 (Pa), and processing time: 20 (sec).

The condition for measurement was as follows.

Excitation X-ray: monochromatic $AlK\alpha_{1,2}$ lines (1486, 6 eV)

X ray radius: 200 μm

Angle of detection of photoelectron: 45°

Data are processed such that the main peak position of neutral carbon (C1s) occurs at 284.60 eV. Under this condition, the coverage of carbon, oxygen, nitrogen and silicon on the back surface of the wafer subjected to Ar plasma treatment is measured.

Experiment 2

In this experiment, the coverage of carbon, oxygen, nitrogen and silicon on the back surface of the wafer subjected to $O_2$ plasma treatment was measured by X-ray photoelectron spectroscopy using PHI Quantera SXM, using the same apparatus, measurement condition and data processing as the experiment 1. Silicon is used to form the wafer. $O_2$ plasma treatment is applied to a ground and rinsed surface.

The $O_2$ plasma treatment condition was such that $O_2$: 10 sccm, bias: not applied, RF power: 500 (W), pressure: 20 (Pa), and processing time: 20 (sec).

COMPARATIVE EXAMPLE 1

In this example, the coverage of carbon, oxygen, nitrogen and silicon on the back surface of the wafer not subjected to plasma treatment was measured by X-ray photoelectron spectroscopy using PHI Quantera SXM, using the same apparatus, measurement condition and data processing as the experiment 1. Silicon is used to form the wafer, which is ground and rinsed.

FIGS. 14 and 15 illustrate results of measurement to determine the coverage of carbon, oxygen, nitrogen and silicon in the experiment 1, experiment 2 and comparative example 1.

As illustrated in FIG. 14, the coverage of carbon on the back surface of the wafer in the experiment 1 and the experiment 2 is smaller than the coverage of carbon on the back surface of the wafer in the comparative example 1. Two wafers treated under the same condition exhibit no significant differences. This reveals that the Ar plasma treatment and $O_2$ plasma treatment applied to the back surface of the wafer both have the effect of reducing the coverage of carbon on the back surface of the wafer and is effective in improving adhesion on the back surface of the wafer.

As illustrated in FIG. 15, the COO (CON) component in the experiment 1 and experiment 2 is increased in comparison with the COO (CON) component on the back surface of the wafer in the comparative example 1. Two wafers treated under the same condition exhibit no significant differences. This reveals that the Ar plasma treatment and $O_2$ plasma treatment applied to the back surface of the wafer both have the effect of increasing the COO (CON) component on the back surface of the wafer and is effective in improving adhesion on the back surface of the wafer.

In the fourth and fifth embodiments, ultraviolet process may be performed instead of plasma treatment. By performing substrate-to-substrate adhesion instead of adhesion between semiconductor chips in the fourth and fifth embodiments, a similar significant improvement in the interface adhesion via the adhesive layer 510 is still achieved.

What is claimed is:

1. A semiconductor apparatus comprising:
a substrate;
elements provided on said substrate; and
a sealing compound provided on said substrate and sealing said elements, wherein said elements and said sealing compound are in contact with each other, wherein plasma treated surfaces of said elements are in contact with said sealing compound,
wherein the sealing compound is a composite of a rolled copper foil and a resin insulating film, and wherein the rolled copper foil is on a first surface of the sealing compound and the resin insulating film is on a second surface opposite from the first surface.

2. The semiconductor apparatus according to claim 1, wherein said substrate and said sealing compound are in contact with each other, and minute projections on a surface of said substrate are in contact with said sealing compound.

3. The semiconductor apparatus according to claim 1, wherein the resin insulating film of the sealing compound is in contact with the elements.

* * * * *